(12) United States Patent
Gerald, II et al.

(10) Patent No.: US 7,486,078 B1
(45) Date of Patent: Feb. 3, 2009

(54) COMPACT ORTHOGONAL NMR FIELD SENSOR

(75) Inventors: Rex E. Gerald, II, Brookfield, IL (US); Jerome W. Rathke, Homer Glen, IL (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 155 days.

(21) Appl. No.: 11/555,416

(22) Filed: Nov. 1, 2006

(51) Int. Cl.
*G01V 3/00* (2006.01)

(52) U.S. Cl. .............. 324/321; 324/322; 324/318; 324/309; 324/307

(58) Field of Classification Search ......... 324/318–322, 324/300–317; 600/410–435; 333/219–235
See application file for complete search history.

(56) References Cited

U.S. PATENT DOCUMENTS 6,788,064 B2 *  9/2004  Gerald et al. ............. 324/322
7,268,552 B1 *  9/2007  Gerald et al. ............. 324/318
2003/0173967 A1 *  9/2003  Gerald et al. ............. 324/322

* cited by examiner

*Primary Examiner*—Brij B. Shrivastav
*Assistant Examiner*—Tiffany A Fetzner
(74) *Attorney, Agent, or Firm*—Michael J. Dobbs; Brian J. Lally; Paul A. Gottlieb

(57) ABSTRACT

A Compact Orthogonal Field Sensor for emitting two orthogonal electro-magnetic fields in a common space. More particularly, a replacement inductor for existing NMR (Nuclear Magnetic Resonance) sensors to allow for NMR imaging. The Compact Orthogonal Field Sensor has a conductive coil and a central conductor electrically connected in series. The central conductor is at least partially surrounded by the coil. The coil and central conductor are electrically or electro-magnetically connected to a device having a means for producing or inducing a current through the coil and central conductor. The Compact Orthogonal Field Sensor can be used in NMR imaging applications to determine the position and the associated NMR spectrum of a sample within the electro-magnetic field of the central conductor.

19 Claims, 12 Drawing Sheets

Prior Art

Prior Art

COMPACT ORTHOGONAL NMR FIELD SENSOR

GOVERNMENT INTERESTS

The United States Government has rights in this invention pursuant to Contract No. W-31-109-ENG-38, between the U.S. Department of Energy (DOE) and the University of Chicago.

FIELD OF THE INVENTION

The present invention relates to a Compact Orthogonal Field Sensor for emitting two orthogonal electro-magnetic fields in a common space. More particularly, the present invention relates to a replacement sensor for existing NMR (Nuclear Magnetic Resonance) sensors to allow for NMR imaging.

BACKGROUND OF THE INVENTION

NMR (Nuclear Magnetic Resonance) spectroscopy is one of the principal techniques used to obtain physical, chemical, electronic and structural information about a molecule. By studying the peaks of nuclear magnetic resonance spectra, skilled chemists are able to determine the structure of many compounds. For example, proton, carbon, nitrogen, and phosphorous NMR spectroscopy are widely used in studies of protein structures. NMR can be a very selective technique, distinguishing among many atoms within a molecule or collection of molecules of the same type but which differ only in terms of their local chemical environment. The most commonly recognized use of NMR is in magnetic resonance imaging for medical diagnosis.

Generally, NMR systems comprise a probe and a console. The NMR probe generally has a NMR probe sensor and NMR probe electronics. The sensor is generally a solenoid or Helmholtz coil. The NMR probe electronics are generally different components for tuning the sensor, including adjustable capacitors, and inductors. The NMR console is generally a computer and radio frequency system capable of producing and detecting a current induced in the NMR probe, specifically the NMR probe sensor. Software on the NMR console constructs a graph of the chemical spectrum.

NMR sensors known in the art include solenoid, Helmholtz, and toroid coils. For example, FIG. 5a shows a solenoid coil 40 useful for recording NMR spectra. A general practice is to place a sample 42 in a sample container 44 at the center of a solenoid coil 40. Sample interrogation produces chemical information about the sample as shown in the NMR spectrum 46 depicted in FIG. 5b. Unfortunately, the NMR spectrum 46 shown in FIG. 5b does not provide information about the location of the sample in the solenoid coil 40. For example, if the sample container 44 is moved towards a winding of the solenoid coil 40 as shown in FIG. 6a, the NMR sensor will produce the NMR spectrum 48 shown in FIG. 6b, which is identical to the NMR spectrum shown in FIG. 5b. Therefore, there is a need for an NMR sensor capable of providing information about the location of the sample in the coil.

Toroid cavity detector (TCD) systems have introduced a radial dimension to NMR sensors, allowing for one-dimensional NMR imaging. For example, U.S. Pat. No. 5,574,370, issued Nov. 12, 1996 to Woelk et al., herein fully incorporated by reference, discloses a toroid cavity detector (TCD) system for determining the spectral properties and distance from a fixed axis for a sample using NMR. The sensor is a toroid cavity with a central conductor oriented along the main axis of the toroid cavity and parallel to a static uniform magnetic field, $B_0$. An RF signal is inputted to the central conductor to produce a magnetic field $B_1$ perpendicular to the central axis of the toroid and whose field strength varies as the inverse of the radial position from the axis of the central conductor within the toroid cavity. The sample is subjected to the respective magnetic fields and the response measured is used by the NMR console to construct an NMR image of the sample adjacent to the central conductor.

The NMR imaging abilities offered by TCD sensors offer numerous advantages. For example, in order to perform imaging with current NMR sensors, external magnet field coils are required to produce magnetic field gradients in the external magnetic field, to cause encoding of the NMR signal, in order to affect images. These expensive gradient coils are not needed to record RFI images with TCDs because the TCD provides a magnetic field gradient itself. In the case of TCDs the gradient is in the RF magnetic field $B_1$ instead of the static magnetic field $B_0$. A gradient in one field or the other is required to affect imaging. With the $B_1$ gradient inherent in a TCD, it is much cheaper to use a TCD for imaging. Unfortunately, a substantial investment is required to replace current NMR sensors with TCDs. Current NMR sensors utilize a coil such as a solenoid or Helmholtz coil, having a relatively large inductance. As a TCD design does not use a coil, but a central conductor having a low inductance, a coil must be added to increase inductance or the NMR sensor tuning circuit needs to be redesigned to account for the lower inductance.

In most cases it is not feasible to increase the inductance of an NMR sensor by adding a coil to the NMR probe. NMR probes are designed to be placed in a compact chamber, where a current in a superconductor solenoid, cooled to extremely low temperatures, produces a strong magnetic field. These probes are designed for maximum efficiency and do not offer room for an additional coil. Furthermore, researchers may be unwilling or unable to retrofit their NMR probes each time they wish to perform NMR imaging.

Furthermore, current NMR sensors provide the desired inductance in a tuned resonant circuit. If a lesser inductance is utilized, the NMR sensor will resonate at a higher than desirable frequency. If the coil resonates at higher frequencies, the higher frequencies may not be suitable for NMR excitation and detection under conditions of the applied static magnetic field, $B_0$. Even if the sample actually receives the higher frequencies, the sample may not adequately respond to the higher frequencies. Furthermore, the high frequencies may interact with the NMR sensor as well as other adjacent systems causing incorrect readings and possibly damage. Therefore, there exists a need for a drop-in-replacement to existing NMR sensors economically enhancing them for NMR imaging.

Current NMR systems utilize thermocouples as an additional component in the NMR probe to indirectly measure the temperature of a sample. This often posses a problem since the NMR probe is confined to a small area. Furthermore, since the sample is often heated or cooled by a focused air stream, the temperature of the thermocouple may be not be indicative of the true temperature of the sample. Therefore, there exists a need for a more direct real time temperature determination of a sample, without requiring additional components.

Therefore, it is an object of one embodiment of the present invention to provide an NMR sensor design that is a drop-in-replacement inductor for existing NMR probes. It is a further object of one embodiment of the present invention for a drop-in-replacement inductor capable of being used for NMR imaging. It is a further object of one embodiment of the present invention to provide a single sensor capable of producing two orthogonal electro-magnetic fields in the same space. Even still, it is an object of one embodiment of the present invention for in situ, accurate temperature measurement of a sample.

SUMMARY OF THE INVENTION

The present invention relates to a Compact Orthogonal Field Sensor having a conductive coil and a central conductor electrically connected in series. The central conductor is at least partially surrounded by the coil. The coil and central conductor are electrically or electro-magnetically connected to a device having a means for producing or inducing a current through the coil and central conductor.

BRIEF DESCRIPTION OF THE DRAWINGS

FIG. 5b is a NMR spectrum of a sample from the solenoid coil in FIG. 5a.

FIG. 6b is a NMR spectrum of a sample from the solenoid coil in FIG. 6a.

FIG. 7b is a NMR image of a sample from the Compact Orthogonal Field Sensor in FIG. 7a.

FIG. 8b is a NMR image of a sample from the Compact Orthogonal Field Sensor in FIG. 8a.

DETAILED DESCRIPTION OF THE INVENTION

The present invention relates to a Compact Orthogonal Field Sensor having a conductive solenoid coil and a central conductor electrically connected in series at a juncture point. The central conductor is at least partially surrounded by the coil. The Compact Orthogonal Field Sensor is connected to a device for creating an electrical current in the coil and central conductor. For example the Compact Orthogonal Field Sensor may be electrically connected to a signal transmitter/receiver, or an NMR console, which produces an electrical current in the coil and central conductor. A current may also be induced in the Compact Orthogonal Field Sensor by electro-magnetic energy, for example by NMR (nuclear magnetic resonance) from a sample.

Figure 1:
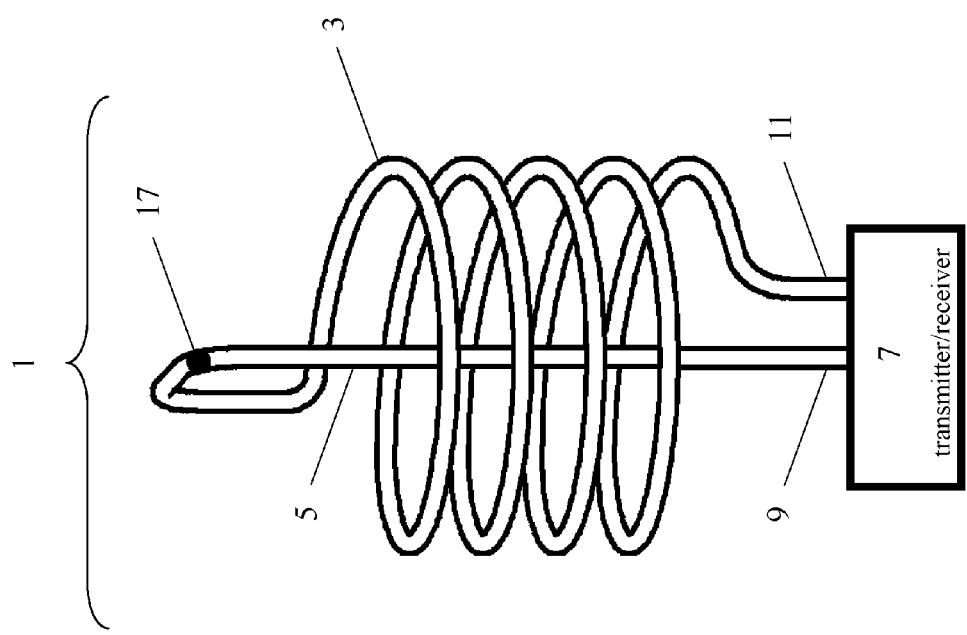
FIG. 1 is a side view of one embodiment of a Compact Orthogonal Field Sensor.

FIG. 1 shows one embodiment of a Compact Orthogonal Field Sensor 1 having a coil 3 and a central conductor 5 electrically connected in series at a juncture point 17. The juncture point 17 is a transition point between the coil 3 and the central conductor 5. The juncture point 17 can be a connection electrically connecting the coil 3 and central conductor 5, for example, a solder joint, clamp, inductor, capacitor, or resistor. The coil 3 and the central conductor 5 may also be constructed from a single conductor being wound into a coil 3 having a central conductor 5, in which case the juncture point 17 is the point of transition between the coil 3 and the central conductor 5.

The central conductor 5 is positioned parallel to the central axis of the coil 3, parallel with the length of the coil 3. The central conductor 5 is positioned partially within the coil 3. In this embodiment, the coil 3 and central conductor 5 are electrically connected to a signal transmitter/receiver 7 by one or more wires, preferably by a first wire 9 connecting the central conductor 5 to the signal transmitter/receiver 7, and a second wire 11 connecting the coil 3 to the signal transmitter/receiver 7. In an alternate embodiment, the central conductor 5 may be positioned off-center or off-parallel to the central axis of the coil 3 to add anisotropic sensitivity to the sensor.

Therefore, the conductive solenoid coil 3 and the central conductor 5 form one continuous piece starting with a first end defining the central conductor 5 and ending with a second end defining the conductive solenoid coil 3. The first end of the central conductor 5 and the conductive solenoid coil 3 continuous piece is connected to the transmitter/receiver 7 by the first wire 9. Likewise, the second end of the central conductor 5 and the conductive solenoid coil 3 continuous piece is connected to the transmitter/receiver 7 by the second wire 11.

The signal transmitter/receiver 7 produces, detects, or produces and detects a current in the coil 3 and the central conductor 5. The signal transmitter/receiver 7 may produce an electrical current, preferably by using a current source. For example, the signal transmitter/receiver 7 may produce a current in the coil 3 and central conductor 5 and use the Compact Orthogonal Field Sensor 1 as a transmitting antenna in order to transmit a unidirectional electro-magnetic signal. In this embodiment, a stronger electro-magnetic signal will be transmitted by the coil 3 than by the central conductor 5.

The signal transmitter/receiver 7 may also detect electro-magnetic fields by detecting an induced current, from an electro-magnetic field, in the coil 3 and the central conductor 5, preferably by the use of a current sensor. For example, the signal transmitter/receiver 7 may detect an induced current in the coil 3 and central conductor 5 and use the Compact Orthogonal Field Sensor 1 as a receiving antenna in order to receive a unidirectional electro-magnetic signal. In this embodiment, the coil 3 will be more sensitive to an electro-magnetic signal than the central conductor The signal transmitter/receiver 7 may also produce and detect a current in the coil 3 and the central conductor 5. In this embodiment, the current detector is preferably disconnected from the Compact Orthogonal Field Sensor 1 while the signal transmitter/receiver 7 is transmitting to prevent damaging the current detector. For example, the signal transmitter/receiver 7 may detect an induced current in the coil 3 and central conductor 5 using a current sensor and produce a current in the coil 3 and central conductor 5 using a current source. In this embodiment, the signal transmitter/receiver 7 may use the Compact Orthogonal Field Sensor 1 as a transmitting and receiving unidirectional antenna.

The central conductor 5 generates and detects electro-magnetic fields having a direction perpendicular to its length, and the coil 3 generates or detects electro-magnetic field having a direction parallel to its axis. Therefore, the electro-magnetic field generated or detected by the coil 3 has a direction perpendicular to the electromagnetic field generated by the central conductor 5.

The coil 3 is a solenoid coil made of an electrically conductive material and has a shape whereby the magnetic field emitted on the application of electrical current through the coil 3 is perpendicular to the direction of the magnetic field emitted by the central conductor. The coil 3 is preferably made of copper, gold, silver, aluminum, titanium, constantan, iron, chromium, platinum, rhodium, and combinations or alloys thereof.

The central conductor 5 is made of any electrically conducting material, and is positioned whereby on the application of an electrical current a magnetic field is created perpendicular to the magnetic field created by the coil 3. The central conductor 5 is at least partially located within the coil 3 and positioned whereby the length of the central conductor 5 is parallel or off-parallel to the center axis of the coil 3. Preferably, the majority of the central conductor 5 is located within the coil 3. The central conductor 5 is preferably made of copper, gold, silver, aluminum, titanium, constantan, iron, chromium, platinum, rhodium, and combinations or alloys thereof. The central conductor 5 may have a round, oval, rectangular, or square cross section.

The coil 3 and the central conductor 5 may be constructed of the same material, or more preferably different materials. If the coil 3 and the central conductor 5 are constructed of the same metals, the Compact Orthogonal Field Sensor 1 may be utilized as an in situ temperature sensor by measuring the resistance of the coil 3 and the central conductor 5. If dissimilar metals are used a thermocouple junction will form. As known in the art of thermocouples, the voltage across the thermocouple junction is highly dependent upon temperature. The thermocouple junction coincides with the juncture point 17. In the preferred embodiment, the known characteristics of the coil 3 material and the central conductor 5 material are used to construct an equation whereby the temperature of the coil can be determined by the voltage across the coil 3 and the central conductor 5. Equivalently, the temperature of the coil can be determined by the voltage across the thermocouple junction or juncture point 17. The temperature of the sample is preferably determined by a computer or microcontroller, such as an NMR console.

Figure 2:
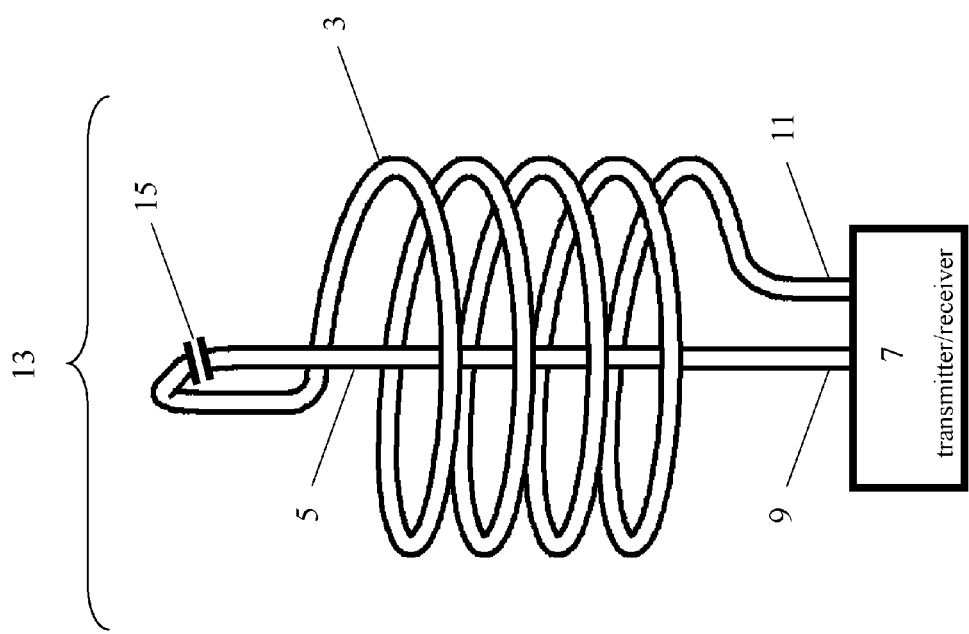
FIG. 2 is a side view of one embodiment of a phase-defined Compact Orthogonal Field Sensor.

In an alternative embodiment shown in FIG. 2, a phase-defined Compact Orthogonal Field Sensor 13 has a coil 3 and a central conductor 5. The coil 3 and the central conductor 5 produce electro-magnetic fields with a defined mutual phase relationship, whereby the electro-magnetic field generated at the coil 3 is of a different phase than the electro-magnetic field generated at the central conductor 5. The phase relationship at juncture point 17 of Compact Orthogonal Field Sensor 1 is changed by placing a capacitor 15 between the coil 3 and the central conductor 5. Preferably, the capacitor is a small ceramic element having a capacitance of about 0.1-10.0 pF, more preferably about 0.1-1.0 pF. This embodiment is desirable for NMR experiments that require sample irradiation by two orthogonal electro-magnetic fields of the same frequency.

Preferably, the Compact Orthogonal Field Sensor is a drop-in-replacement inductor for an existing NMR sensor, allowing for NMR imaging, while not requiring further modification of the NMR circuit. The original NMR probe coil is removed creating a void. A Compact Orthogonal Field Sensor designed as a replacement is then placed entirely within the void created from the removal of the original NMR probe coil.

Figure 3:
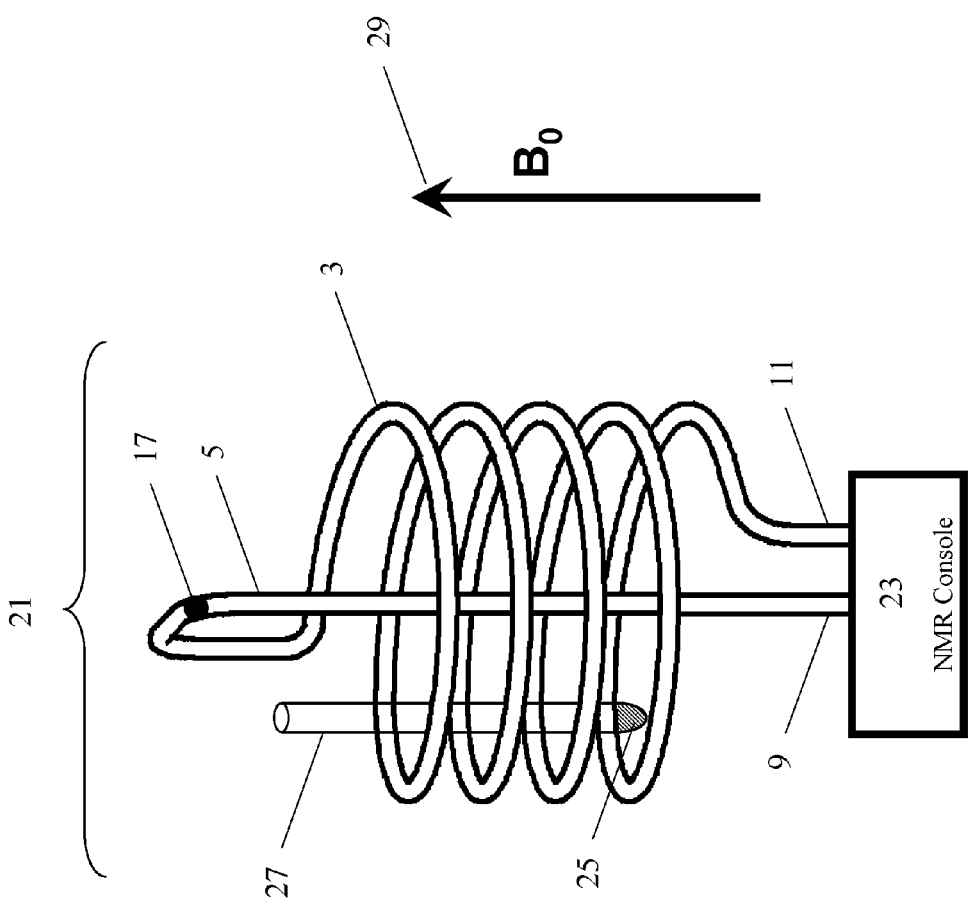
FIG. 3 is a side view of one embodiment of a Compact Orthogonal Field Sensor having a sample container.

In one embodiment of a Compact Orthogonal Field Sensor 21, shown in FIG. 3, is a drop-in-replacement, not requiring additional components, for an existing NMR sensor. The existing NMR sensor, generally a solenoid coil or a Helmholtz coil, is replaced by the Compact Orthogonal Field Sensor 21. The Compact Orthogonal Field Sensor 21 comprises a coil 3 and a central conductor 5. The coil 3 and the central conductor 5 are specifically designed to have the same combined inductance as the coil in the original NMR sensor. The coil 3 and the central conductor 5 are electrically connected in series; the total inductance of the Compact Orthogonal Field Sensor 21 is the sum of the inductances of coil 3 and central conductor 5. The coil 3 and the central conductor 5 are then electrically connected to the NMR console 23, by one or more wires, preferably by a first wire 9 connecting the central conductor 5 to the NMR console 23, and a second wire 11 connecting the coil 3 to the NMR console 23.

The NMR console 23 produces a current through the coil 3 and the central conductor 5 generating electro-magnetic fields. The NMR console 23 also detects an induced current from a sample 25 though the coil 3 and the central conductor 5 determining NMR characteristics of a sample 25. In a preferred application, the NMR console 23 produces an excitation electro-magnetic field and detects an induced current from a sample 25 though the central conductor 5 determining NMR characteristics of a sample 25.

The NMR console 23 produces electro-magnetic fields to excite the nuclear spins in a sample, and detects weak electro-magnetic fields emanated from the sample according to the methods know in the art of NMR spectroscopy and imaging. Since the strength of the electro-magnetic fields generated and received by the central conductor 5 is dependent upon the radial distance between the central conductor 5 and the sample, the NMR console 23 can create an NMR image showing the NMR spectrum in relationship to the distance from the central conductor 5.

The coil 3 and central conductor 5 are selected by determining the inductance of the existing inductor, which may be specified by the manufacture of the original NMR system or NMR sensor, determined by mathematically calculating the inductance of the existing coil, or electronically measuring the inductance of the coil using an inductance meter. Once the inductance of the original NMR sensor inductor is determined, the inductance of the Compact Orthogonal Field Sensor 21 may be adjusted by numerous means known in the art. For example, the number of windings, spacing and diameter of the windings, and conductor material of the coil 3 and the type of coil 3 may be selected to match inductance. The central conductor 5 may also influence the inductance of the NMR Compact Orthogonal Field Sensor 21. For example, the material, and length of the central conductor may be selected to match inductance. Preferably, the coil 3 and the central conductor 5 are made of non-magnetic materials.

The sample 25 is positioned so it will be exposed to the electro-magnetic field emitted from the central conductor 5, preferably at least partially within the coil 3. The sample 25 can be positioned in a variety of ways depending upon the sample. For example a fluid sample 25 can be placed in a container 27, as shown in FIG. 3. The container 27 is preferably attached to the inside of the coil 3. In the alternative the container 27 may be positioned outside of the coil 3. The container 27 may be coupled to the coil 3, for example the container 27 may be attached to the coil 3 by a Teflon tie. The container 27 may also be secured in place by other methods, for example a hanging apparatus. It may also be desirable to apply an external layer of sample 25 on the central conductor 5. This may be useful for analysis of coatings, such as polymers, paints, oils, and different metal oxides. In this embodiment, the coil 3 and central conductor 5 may be utilized as a direct temperature sensor of the sample.

The sample 25 is subjected to an external static magnetic field 29 perpendicular to the electro-magnetic field generated by the central conductor 5. The external static magnetic field

29 is generally generated by a superconducting magnet. The external static magnetic field 29 aligns the magnetic moments of the sample in the direction of the external static magnetic field 29. The NMR console 23 provides an electrical current through the coil 3 and central conductor 5 generating electromagnetic fields. The electro-magnetic field generated by the central conductor 5 disturbs the alignment of the magnetic moments in a sample 25. The magnetic moments of the sample 25 will then precess at a frequency that depends on the atomic and molecular composition sample 25. The NMR console 23 will then detect a current induced from the precessing magnetic moments of the sample 25 in the coil 3 and the central conductor 5. This induced current is used by the NMR console 23 to generate an NMR spectrum and image.

As the sample 25 is moved towards a single coil 3 winding, the local electro-magnetic field from the single winding will dominate the sample. This electro-magnetic domination of the sample will cause additional signals from the sample. These additional signals can be used as location markers in order to determine the vertical location of the sample, since these additional signals are only present when the sample is located in close proximity of the coil 3.

Preferably, the coil 3 and central conductor 5 are made from different materials creating a thermocouple junction. Since the sample is directly connected to the central conductor by highly thermo-conductive materials, the thermocouple junction can reliably determine the temperature of the sample 25. In this embodiment, the NMR console 23 determines the temperature of the sample 25 by measuring the voltage of the thermocouple junction. The NMR console 23, using the known characteristics of the thermocouple junction and the measured voltage calculates the temperature of the thermocouple junction.

Figure 4:
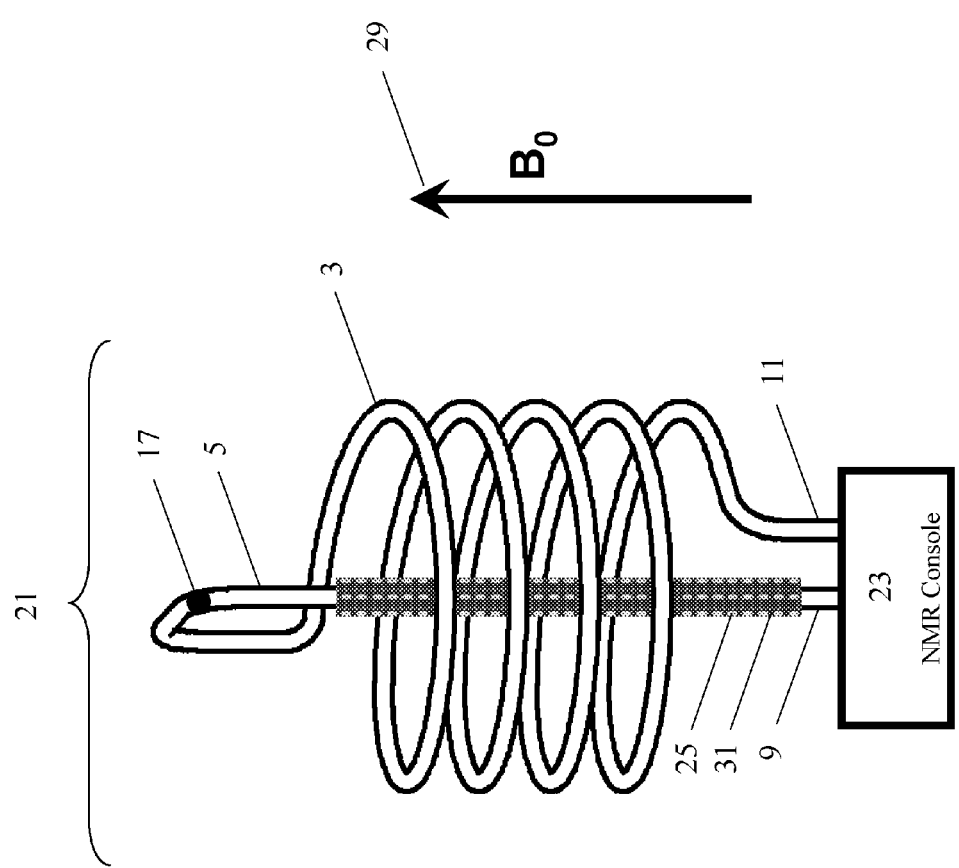
FIG. 4 is a side view of one embodiment of a Compact Orthogonal Field Sensor having a nano-porous anodized-aluminum-oxide layer.

In yet another embodiment shown in FIG. 4, the central conductor 5 is coated with a porous metal oxide coating 31, such as aluminum-oxide or titanium-oxide, preferably porous anodized-aluminum-oxide. The porous metal oxide coating 31 is porous having a multiplicity of pores, each pore preferably having a length between about 1 and 300 microns and a diameter between about 10 and 200 nm. More preferably, each pore has a length between about 10-200 microns and a diameter between about 40 and 100 nm. The pores are directed preferably perpendicular to the long axis of the central conductor 5. The sample 25 can be deposited in the pores using a myriad of methods, preferably by submersing the central conductor 5 with the porous metal oxide coating 31 in the sample 25. The use of a central conductor 5 with a square shape may be desirable when using a porous metal oxide coating 31 to provide a constant pore diameter along the length of the pores.

In yet another embodiment, the permeability of membranes, polymers, paints, etc. is determined by using a central conductor 5 having a porous metal oxide coating 31. Preferably, the central conductor 5 is submersed within a sample protected only by a test membrane. The permeability of the sample through the membrane can then be determined by creating an NMR image of the porous metal oxide coating 31. If the sample could not penetrate the test membrane, the pores within the porous metal oxide coating 31 will be empty, and easily determined by an NMR image. Likewise, if the sample could penetrate the test membrane, the pores within the porous metal oxide coating 31 will contain the sample, which can be easily determined by an NMR image.

An NMR image may be created using a Compact Orthogonal Field Sensor using methods known in the art, preferably Rotating-Frame Imaging (RFI). RFI is one of the many Magnetic Resonance Imaging (MRI) methods that can be used to obtain images without dissecting the sample. The main feature of RFI is a radiofrequency-field gradient ($\Delta B_1$). This gradient is used instead of a conventional MRI static field gradient ($\Delta B_0$) to encode spatial information. One dimensional rotating-frame images are obtained from a set of NMR spectra collected by subjecting the sample sequentially to incrementally increasing radiofrequency pulse width. The amplitude modulated response from the sample, where the modulation frequency is the nutation frequency ($^1H\gamma B_1$ (kHz)), is converted (by a second real Fourier transformation) into a three-dimensional plot, (an image with one spatial dimension) revealing spectral information of the sample on the first axis ($^1H$ Chemical Shift (PPM)), spatial information about the location of the sample on the second axis (Sample Position $^1H\gamma B_1$ (kHz)), and the amount of sample on the third, vertical axis (Sample Amount (A.U.)) (See FIG. 7b and FIG. 8b). If the dependency of nutation frequencies on the spatial dimension is known, the locations of NMR-active nuclei can be calculated. A more detailed description may be found in "Rotating-Frame NMR Microscopy Using Toroid Cavity Detectors" K. Woelk, J. W. Rathke, and R. J. Klingler, J. Magn. Reson. A 105, 113-116 (1993), herein fully incorporated by reference.

Figure 7A:
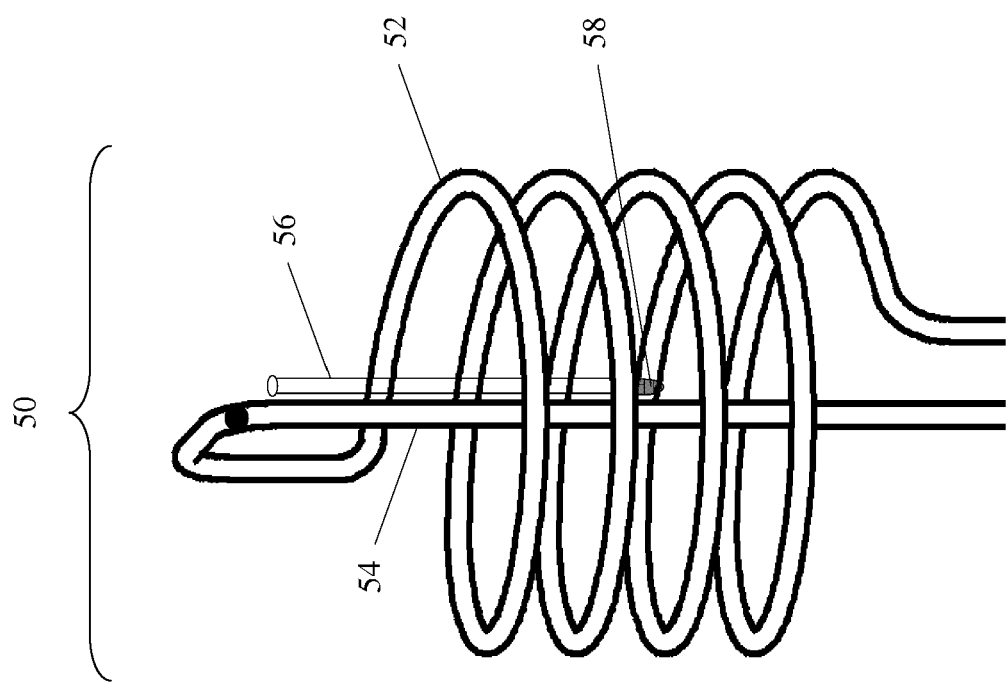
FIG. 7a is side view an embodiment of a Compact Orthogonal Field Sensor having a sample adjacent to the central conductor.

As an example, the solenoid (and stator) of a Bruker 500 MHz H-X 7-mm MAS probe, was replaced with the Compact Orthogonal Field Sensor 50 shown in FIG. 7a. The Compact Orthogonal Field Sensor 50 comprises a solenoid coil 52 made of 18 gauge (1.0 mm o.d.) copper wire and a co-axial central conductor 54 made of 2 gauge (6.5 mm o.d.) aluminum rod. A sample container 56 and sample 58 is positioned within the windings of the solenoid coil 52 and adjacent to the central conductor 54.

Figure 7B:
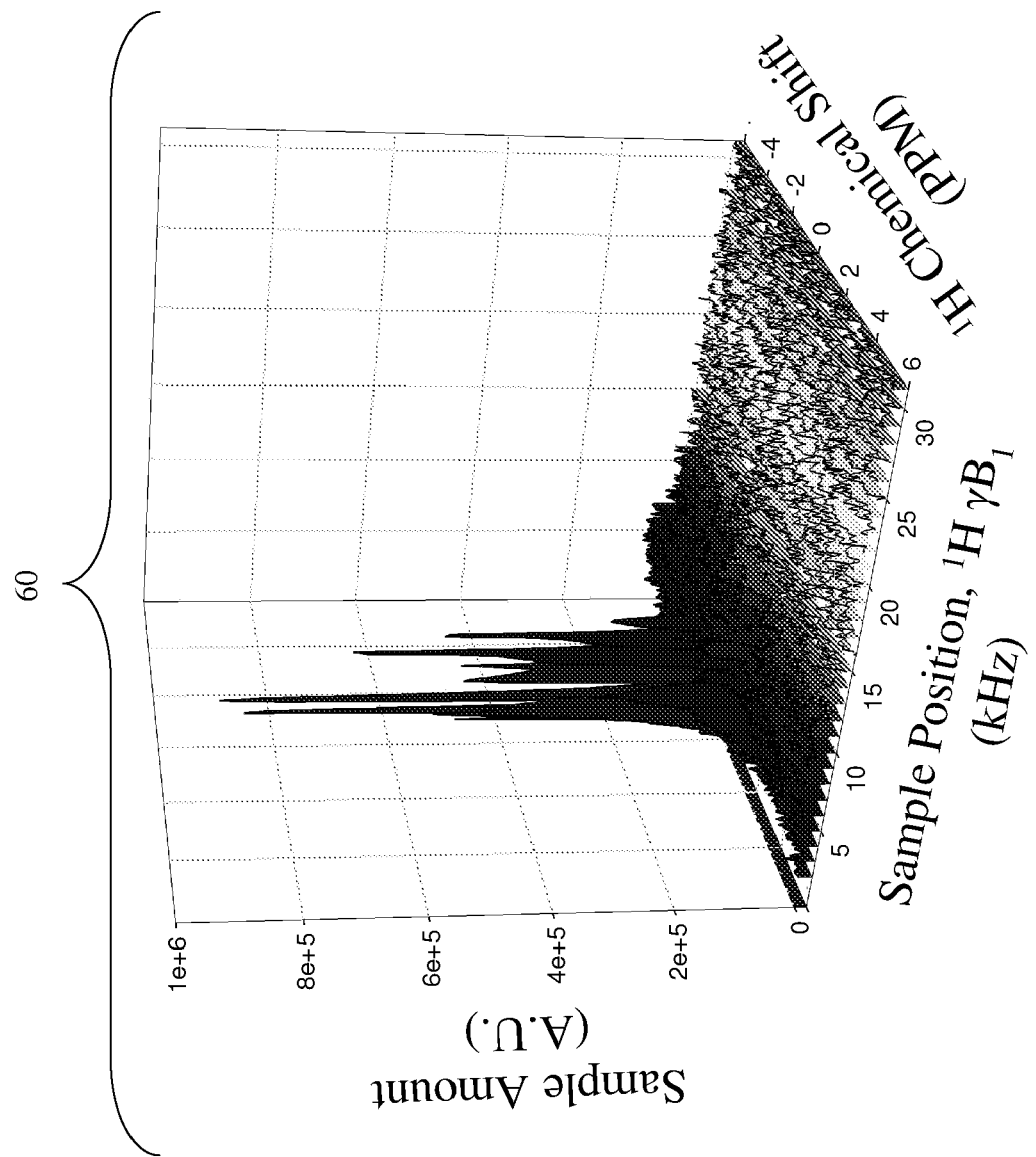

FIG. 7b shows the NMR image 60 recorded for the sample 58 by the Compact Orthogonal Field Sensor 50 in FIG. 7a using RFI. The NMR image 60 is a three-dimensional plot, providing one dimension of spatial information, one dimension of chemical information, and one dimension of quantity information. Thus, the NMR image 60 reveals spectral information of the sample 58 on the first axis ($^1H$ Chemical Shift (PPM)), spatial information about the location of the sample 58 on the second axis (Sample Position $^1H\gamma B_1$ (kHz)), and the amount of sample 58 on the third, vertical axis (Sample Amount (A.U.)). The features of the NMR image 60 of FIG. 7b characterize the chemical composition of the sample 58, the quantity of the sample 58, and the location of the sample 58 adjacent to the central conductor 54.

Figure 5A:
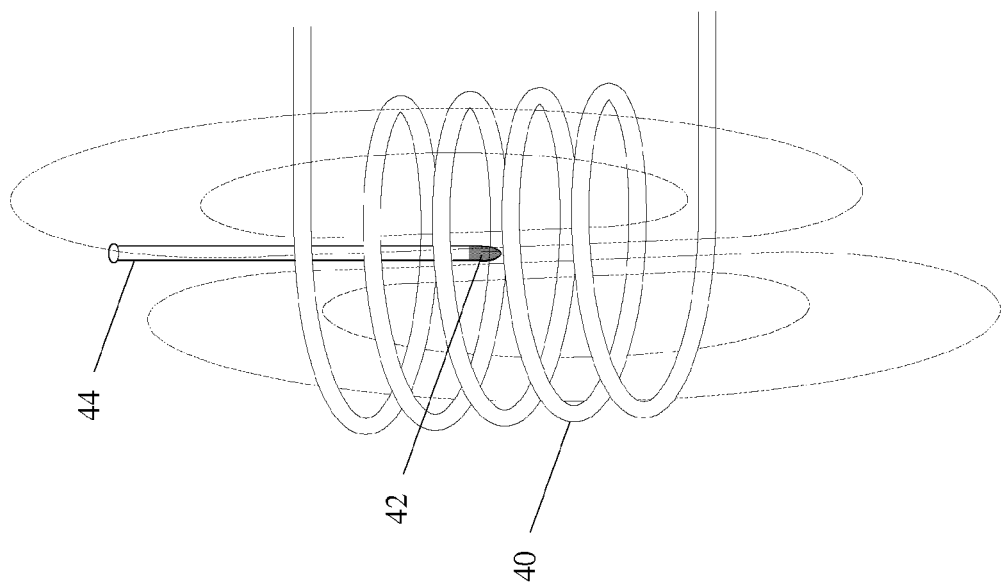
FIG. 5a is side view of a solenoid NMR coil having a sample at the central axis of the solenoid coil.
Figure 5B:
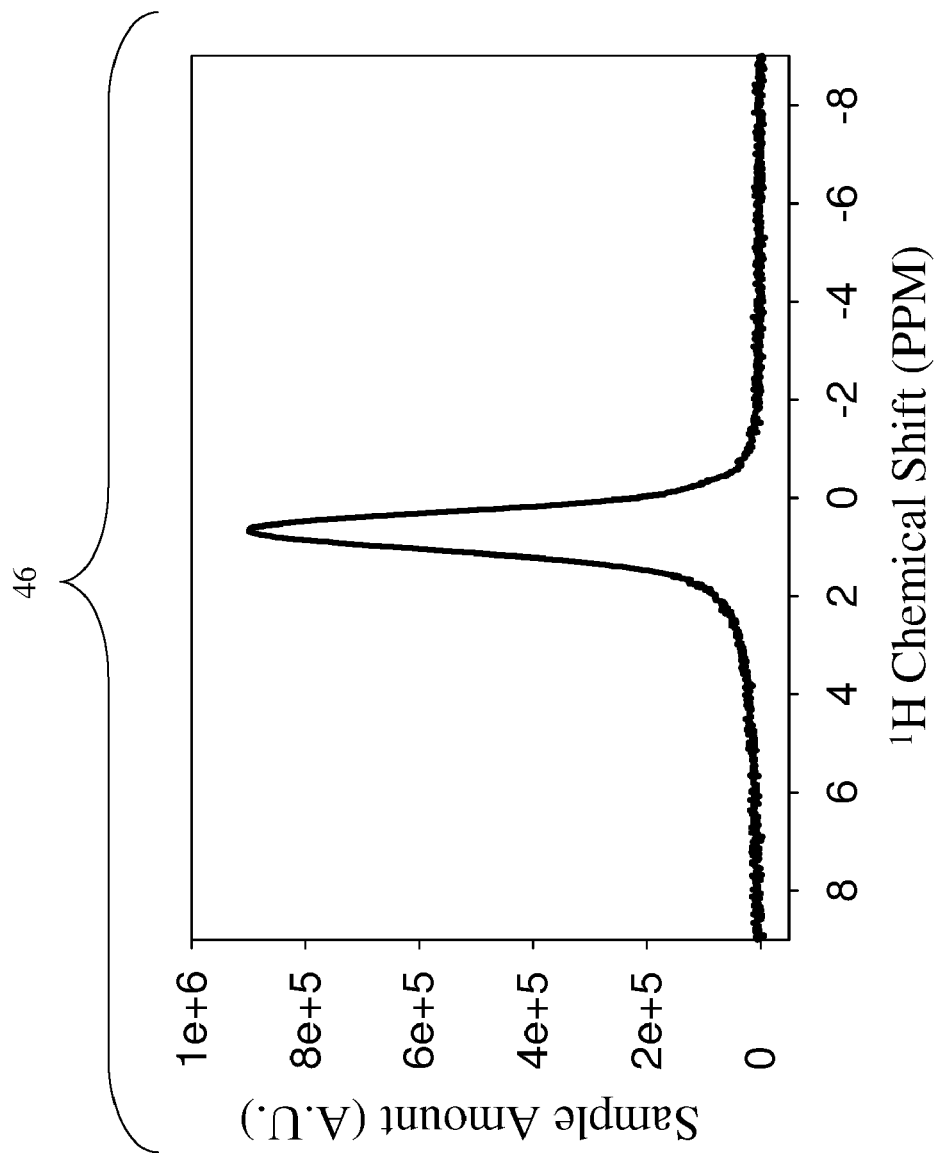
Figure 6A:
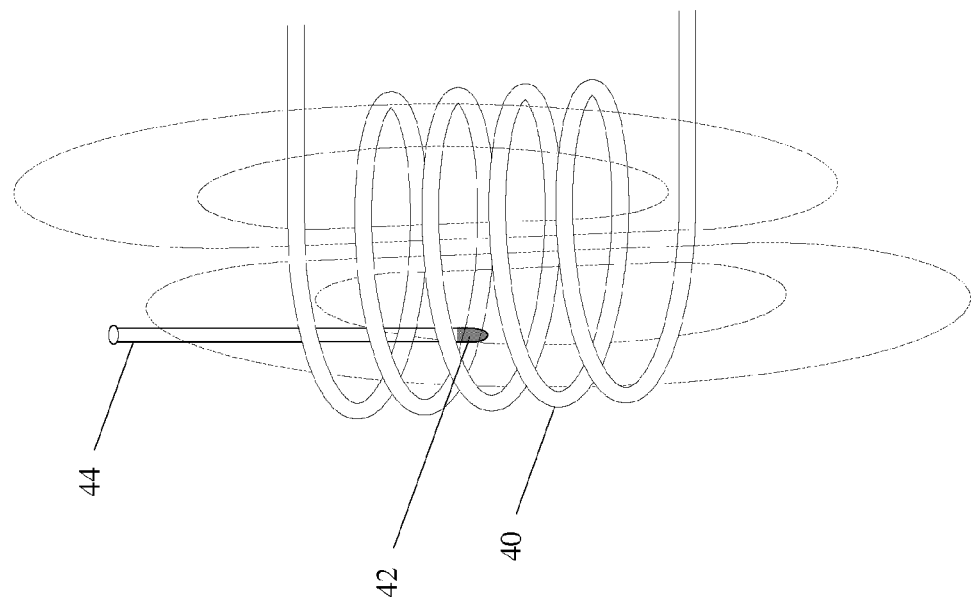
FIG. 6a is side view of a solenoid NMR coil having a sample adjacent to a winding of the solenoid coil.
Figure 6B:
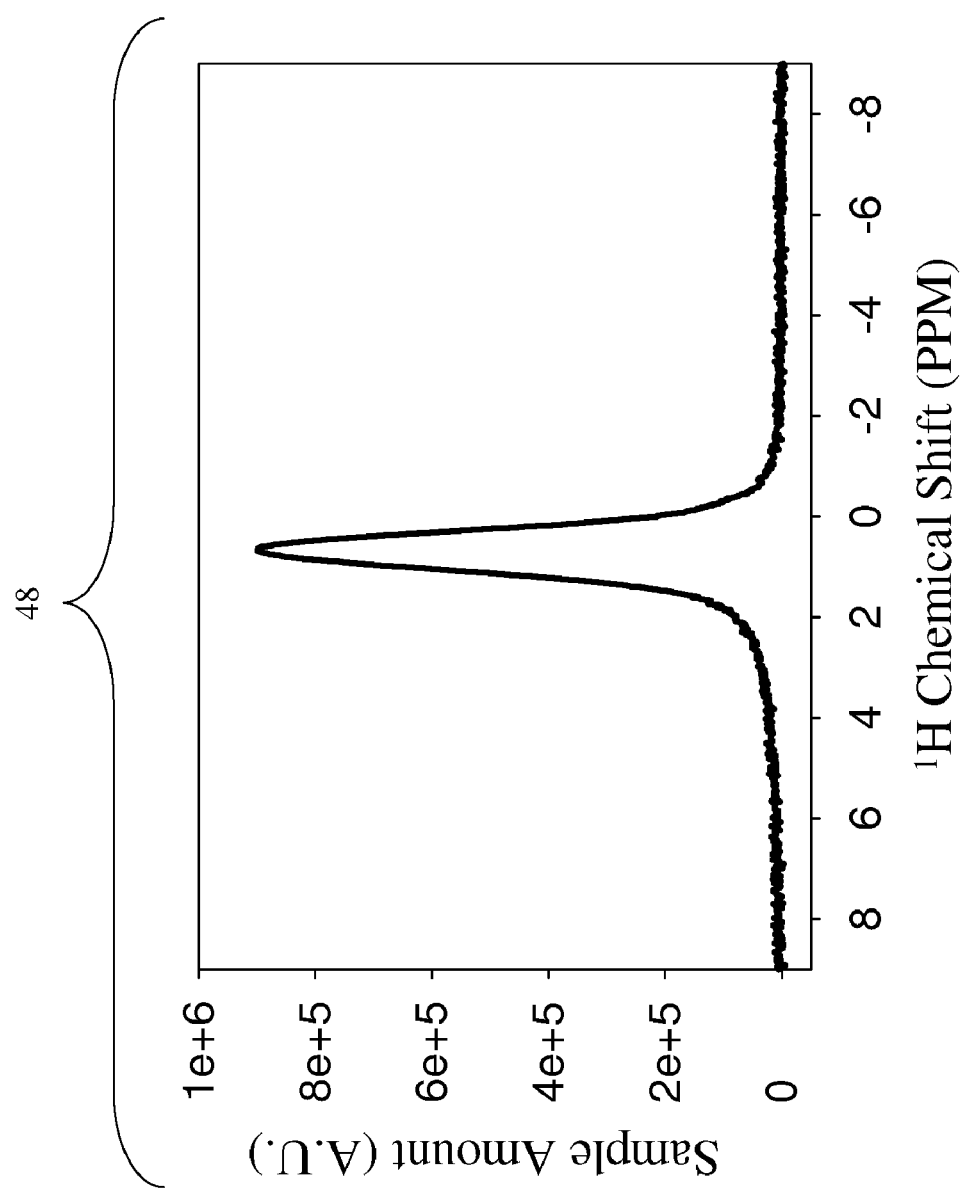
Figure 8A:
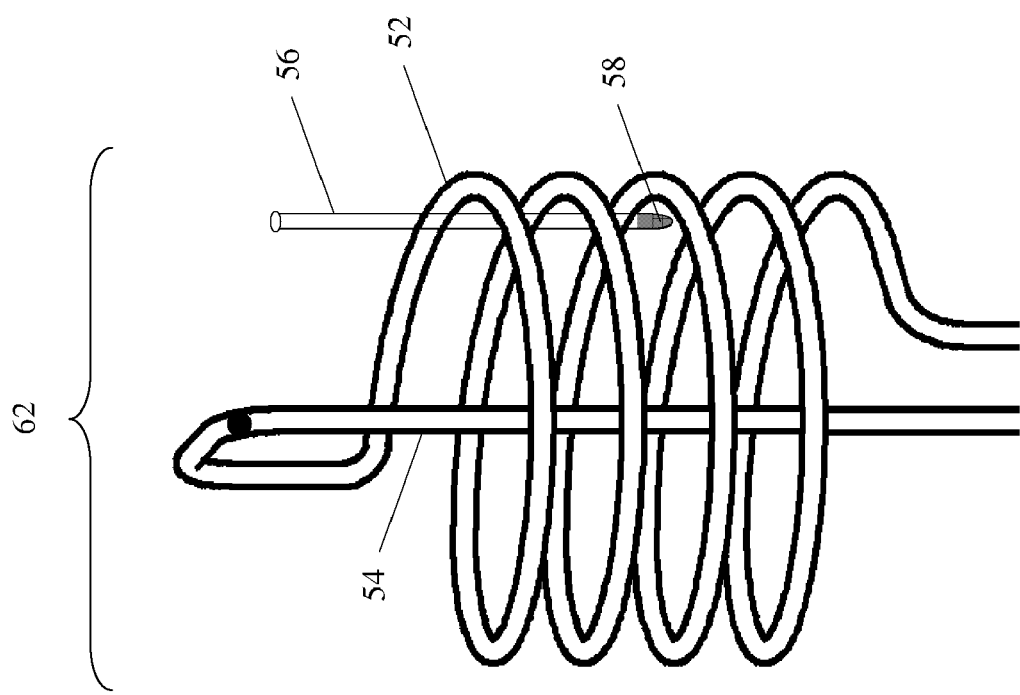
FIG. 8a is side view an embodiment of a Compact Orthogonal Field Sensor having a sample adjacent to a winding of the coil.
Figure 8B:
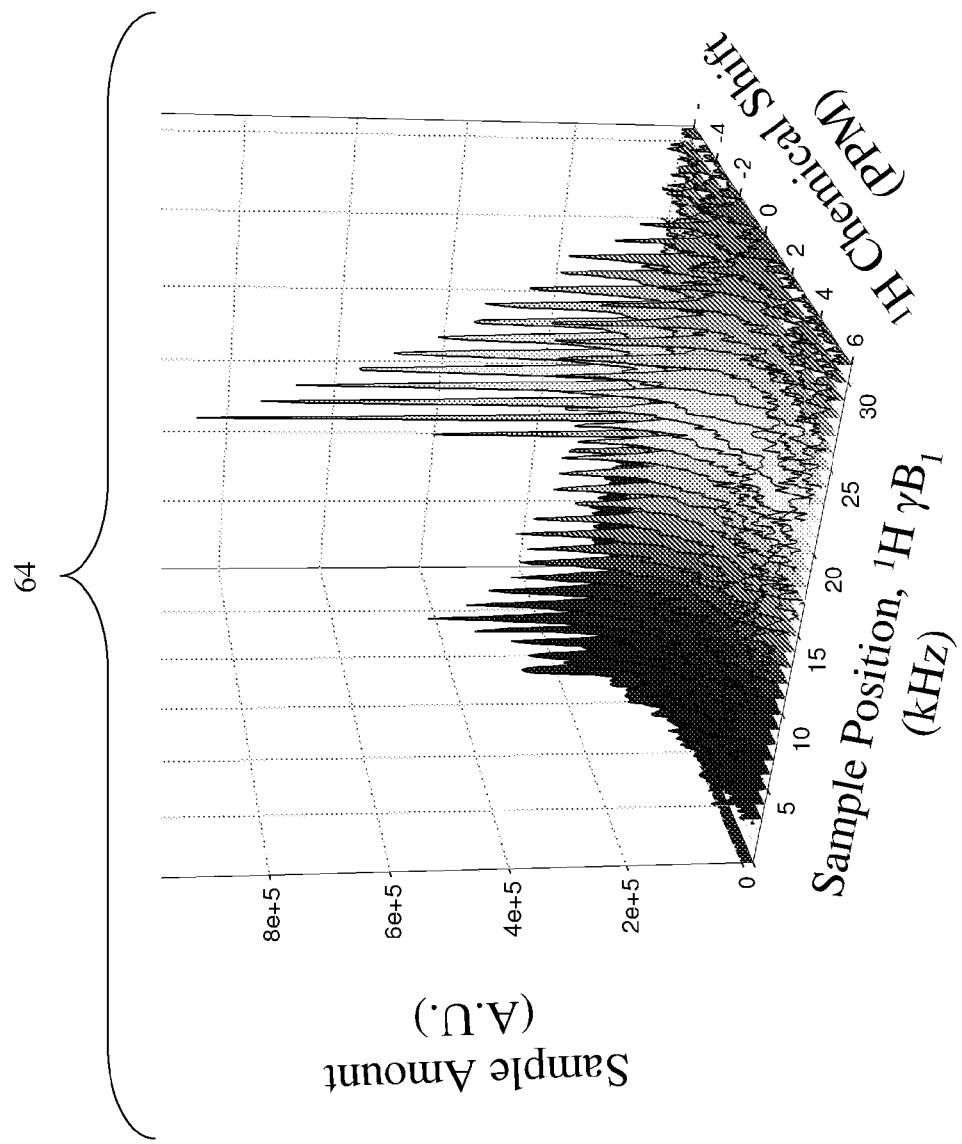

FIG. 8a shows the Compact Orthogonal Field Sensor 50 of FIG. 7a with the sample 58 positioned within the coil 52 and adjacent to a winding of the coil 52, away from the central conductor 54. FIG. 8b shows the NMR image 64 recorded for the sample 58 by the Compact Orthogonal Field Sensor 62 in FIG. 8a. The features of the NMR image 64 of FIG. 8b characterize the chemical composition of the sample 58, the quantity of the sample 58, and the location of the sample 58 adjacent to a winding of the coil 52, and away from the central conductor 54. Comparison of FIGS. 7b and 8b demonstrates that the Compact Orthogonal Field Sensor provides a different response for the same sample 58 positioned at different positions in the coil 52. In contradistinction, comparison of FIGS. 5b and 6b demonstrates that the NMR probe using a solenoid coil 40 does not provide a different response for a sample 42 positioned at different positions in the solenoid coil 40.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C.§ 112, ¶6. In particular, the use of "step of" in the claims herein is not intended to invoke the provisions of 35 U.S.C.§ 112, å6.

What is claimed is:

1. A Compact Orthogonal NMR Field Sensor comprising:
   a conductive solenoid coil having a central axis;
   a central conductor electrically connected in series directly to said conductive solenoid coil;
   said central conductor and said conductive solenoid coil forming one continuous piece starting with a first end defining said central conductor and ending with a second end defining said conductive solenoid coil;
   said central conductor also being at least partially surrounded by said conductive solenoid coil; and
   a transmitter/receiver connected to both said first end and said second end of said one continuous piece.

2. The Compact Orthogonal NMR Field Sensor of claim 1 whereby said central conductor is positioned parallel and on-center to said central axis of said conductive solenoid coil.

3. The Compact Orthogonal NMR Field Sensor of claim 1 whereby said central conductor is positioned off-center and off-parallel to said central axis of said conductive solenoid coil.

4. The Compact Orthogonal NMR Field Sensor of claim 1 whereby said transmitter/receiver is a current source electrically connected to said first end and said second end.

5. The Compact Orthogonal NMR Field Sensor of claim 1 whereby said transmitter/receiver is electro-magnetically connected to said first end and said second end.

6. The Compact Orthogonal NMR Field Sensor of claim 1 whereby said conductive solenoid coil comprises a material selected from the group of materials consisting of copper, gold, silver, aluminum, titanium, constantan, iron, chromium, platinum, rhodium, and combinations or alloys thereof.

7. The Compact Orthogonal NMR Field Sensor of claim 1 whereby said central conductor comprises a material selected from the group of materials consisting of copper, gold, silver, aluminum, titanium, constantan, iron, chromium, platinum, rhodium, and combinations or alloys thereof.

8. The Compact Orthogonal NMR Field Sensor of claim 1 whereby said conductive solenoid coil is constructed from a material different than said central conductor.

9. The Compact Orthogonal NMR Field Sensor of claim 1 whereby said conductive solenoid coil and said central conductor are constructed from the same material.

10. The Compact Orthogonal NMR Field Sensor of claim 1 whereby said central conductor comprises a porous metal-oxide coating, whereby said coating is adjacent to and connected to said central conductor.

11. The compact orthogonal NMR field sensor of claim 10 whereby said porous metal-oxide coating comprises a plurality of pores; each pore having a length between $1\mu$ and $300\mu$ and a diameter between 10 nm and 200 nm.

12. The compact orthogonal NMR field sensor of claim 1 whereby said central conductor has a length between 10 mm and 40 mm.

13. The Compact Orthogonal NMR Field Sensor of claim 1 whereby said conductive solenoid coil and said central conductor are electrically separated by a capacitor.

14. An NMR system comprising:
    the Compact Orthogonal NMR Field Sensor of claim 1;
    a sample in electro-magnetic communication with said central conductor; and
    an NMR console electrically connected to said Compact Orthogonal NMR Field Sensor.

15. The NMR system of claim 14 whereby said sample is positioned adjacent to said central conductor.

16. The NMR system of claim 14 whereby said sample is a coating adhered to said central conductor.

17. The NMR system of claim 14 whereby said central conductor further comprises a porous anodized-aluminum-oxide coating having a plurality of pores; whereby said sample is within said plurality of pores.

18. The NMR system of claim 17, whereby each pore from said plurality of pores has a length between $1\mu$ and $300\mu$ and a diameter between 10 nm and 200 nm.

19. The NMR system of claim 17 further comprising a membrane connected and adjacent to said porous anodized-aluminum-oxide coating.

* * * * *